United States Patent [19]

Makiguchi et al.

[11] Patent Number: 5,850,071
[45] Date of Patent: Dec. 15, 1998

[54] SUBSTRATE HEATING EQUIPMENT FOR USE IN A SEMICONDUCTOR FABRICATING APPARATUS

[75] Inventors: Issei Makiguchi; Katsuyoshi Hamano; Tokunobu Akao, all of Tokyo, Japan

[73] Assignee: Kokusai Electric Co., Ltd., Japan

[21] Appl. No.: 694,875

[22] Filed: Aug. 9, 1996

[30] Foreign Application Priority Data

Feb. 16, 1996 [JP] Japan .................................. 8-053787

[51] Int. Cl.⁶ .......................... C23C 16/00; H01L 21/324; F27B 5/14
[52] U.S. Cl. .......................... 219/390; 219/405; 219/411; 392/418; 118/728; 118/50.1
[58] Field of Search .................................. 219/385, 390, 219/405, 411, 446, 457, 466; 392/416, 418; 118/50.1, 724, 725, 728, 729; 438/799; 432/121, 122, 152; 165/58, 61

[56] References Cited

U.S. PATENT DOCUMENTS

| | | |
|---|---|---|
| 4,016,006 | 4/1977 | Yoshinaka et al. ....................... 148/1.5 |
| 4,951,601 | 8/1990 | Mayden et al. .......................... 119/729 |
| 4,979,464 | 12/1990 | Kunze-Concewitz et al. ......... 118/724 |
| 5,162,047 | 11/1992 | Wada et al. .............................. 29/25.01 |
| 5,512,320 | 4/1996 | Turner et al. ............................ 118/725 |
| 5,607,009 | 3/1997 | Turner et al. ............................. 165/61 |
| 5,674,786 | 10/1997 | Turner et al. ........................... 414/937 |

*Primary Examiner*—Teresa J. Walberg
*Assistant Examiner*—J. Alham
*Attorney, Agent, or Firm*—Graham & James LLP

[57] ABSTRACT

A substrate heating equipment for use in a semiconductor fabricating apparatus includes a heater support frame disposed within a vacuum vessel, opposed panel heaters disposed in a pluri-shelved fashion within the heater support frame, and support means for supporting a substrate to be treated between an adjacent pair of the opposed panel heaters, whereby simultaneous heating of plural substrates to be treated is enabled. By controlling the individual temperature of the panel heaters, it also becomes possible to significantly reduce a tact time and to effect uniform heating of the substrates while the equipment is rendered compact.

15 Claims, 9 Drawing Sheets

5,850,071

SUBSTRATE HEATING EQUIPMENT FOR USE IN A SEMICONDUCTOR FABRICATING APPARATUS

TECHNICAL BACKGROUND

The present invention relates to a substrate heating equipment for preheating a substrate during a semiconductor fabrication process wherein such treatments as thin film deposition and etching with respect to substrate surfaces are carried out to obtain semiconductors.

Pretreatment of substrate surfaces involves a process for preheating the relevant substrates to a treatment temperature.

A conventional substrate heating equipment will now be described with reference to FIG. 10 and FIG. 11 hereof.

Vacuum vessel 1 is comprised of a container body 2 and an upper cover 3. On an underside of the upper cover 3, heating lamps 5 are secured by means of an insulating support 4. Below the heating lamps 5, there is provided a far-infrared light radiating plate 10. Provided on a bottom surface of the container body 2 by means of a pedestal 6 is a cooling plate 7 to which heating lamps 9 are secured by means of an insulating support 8. Above the heating lamps 9, there is provided a far-infrared light radiating plate 11.

A vertically movable rod 12 extends through the bottom of the container body 2 with a portion allowing passage of the rod 12 being sealed airtight by means of a bellows 13. A lower end of the rod 12 is connected to a vertically movable cylinder (not shown). Secured to an upper end of the rod 12 is a support pin base 14. From the support pin base 14, four support pins 15 extend vertically through the cooling plate 7 and the far-infrared light radiating plate 11 and project from the latter 11 upwardly.

The upper cover 3 has a cooling water passage 17 with which a supply-exhaust pipe 18 communicates. The cooling plate 7 has a cooling water passage 19 with which a supply-exhaust pipe 20 communicates. The supply-exhaust pipes 18, 20 communicate with a source of cooling water (not shown). The heating lamps 5, 9 are connected to a source of electrical power not shown, via an electrical current input terminals 21 disposed airtightly on the upper cover 3 and at the bottom of the container body 2. Designated by reference numeral 22 in the drawing figures is a substrate transport opening for loading and unloading a substrate 23 to be treated.

The substrate 23 to be treated is loaded through the substrate transport opening 22 by a transport arm not shown and is transferred onto the support pins 15 from the transport arm by up and down movements of the support pin base 14 caused by the vertically movable cylinder (not shown). The substrate 23 to be treated is heated while it is interposedly supported between the far-infrared light radiating plate 10 and the far-infrared light radiating plate 11.

Upon energization of the heating lamps 5 and 9, the far-infrared light radiating plates 10 and 11 are heated and produce radiant heat. The substrate 23 to be treated is heated by the radiant heat from the far-infrared light radiating plates 10 and 11. After the heat treatment is completed, the substrate 23 to be treated is unloaded through the substrate transport opening 22 by the transport arm (not shown).

The time required to heat treat each substrate in the above-explained substrate heating equipment (tact time) affects the productivity of the semiconductor fabricating apparatus. Whereas, the conventional substrate heating equipment has drawbacks in that it is arranged to heat substrates one by one, thus consuming a temperature rise time for each substrate and a transport time required for loading and unloading each substrate. Furthermore, the equipment encounters restrictions such that the rate of temperature rise needs to be controlled so as not to cause the substrates to be thermally distorted. Consequently, it is not possible for the equipment to significantly reduce the tact time required for each substrate to be heat treated.

With a view to reduce the tact time, there have been proposed substrate heating equipments wherein a plurality of substrates can be heat treated simultaneously. One example of such equipments is disclosed in Japanese Patent Laid-Open Publication No. 89-216522. As shown in FIG. 12 hereof, the equipment disclosed in the publication includes a heating vessel 90 and a susceptor 91 disposed internally of the heating vessel 90. On the susceptor 91, substrates 92 to be treated and heating plates 93 are alternately disposed to extend vertically therefrom. Microwaves generated by a microwave generation source 94 are led into the heating vessel 90 and absorbed by the heating plates 93, whereby the heating plates 93 are heated to in turn heat the substrates 92.

However, it is difficult to control the heating conditions in the substrate heating equipment shown in FIG. 12. Further, it is impossible to control the temperature of the heating plates 93 individually. Moreover, because conditions in absorbing microwaves are dependent on the position of the heating plate 93 it is quite hard to cause the heating plates to be heated under the same conditions. As a consequence, it is quite difficult to achieve the desired uniform heating of the plural substrates within the substrate heating equipment.

SUMMARY OF THE INVENTION

It is therefore an object of the present invention to provide a substrate heating equipment for use in a semiconductor fabricating apparatus, which is designed to allow heating of a plurality of substrates simultaneously to thereby achieve significant reduction of a tact time. Another object of the present invention is to provide such an equipment which is compactly arranged. Still another object of the present invention is to provide such an equipment which allows uniform heating of the substrates.

According to the present invention, there is provided a substrate heating equipment for use in a semiconductor fabricating apparatus, which comprises a heater support frame disposed within a vacuum vessel, opposed panel heaters disposed in a pluri-shelved fashion within the heater support frame, and support means for supporting a substrate to be treated between an adjacent pair of the opposed panel heaters.

The equipment may further comprise side panel heaters disposed at both ends of the opposed panel heaters.

In a specific form, the opposed panel heaters are secured to the heater support frame at central portions of side portions thereof, and an insulative collar is disposed at each side end of the opposed panel heaters, and the insulative collar is fit into recesses disposed in the heater support frame.

Preferably, the heater support frame includes a substrate receiver attached thereto and being capable of loading the substrate to be treated along one edge of the substrate to be treated, and the opposed panel heaters include a substrate guiding pin partially buried therein and adapted to guide an opposite edge of the substrate to be treated.

The panel heaters may be cast panel heaters of aluminum in which heater wires are embedded.

Importantly, the panel heaters are individually temperature controlled.

Each of the panel heaters is divided into a plurality of zones, and the zones are individually temperature controlled.

The side panel heaters are heating elements and are thermally insulated from at least a side of the heater support frame. The opposed panel heaters are bridged between right and left ones of the side panel heaters, and the opposed panel heaters are heated through thermal conduction by the side panel heaters.

The side panel heaters have vertically divided into heating zones which are individually temperature controlled.

The side panel heaters have shelves capable of receiving ends of the opposed panel heaters, the ends of the opposed panel heaters being pressed against the shelves by press means.

Preferably, the press means comprises heater presses disposed on the ends of the opposed panel heaters, heater dampers fitted with the heater presses and the shelves, and set screws screwed with the heater dampers for pressing the heater presses against the opposed panel heaters.

The heater support frame has reflecting plates.

The vacuum vessel is adapted to allow loading of the substrates through a side wall thereof, and the heater support frame is supported by a strut passing airtightly through a bottom plate of the vacuum vessel. The strut includes a screw rod connected thereto by means of a nut, which is designed to be rotationally driven by a vertically movable motor.

BRIEF DESCRIPTION OF THE DRAWINGS

Preferred embodiments of the present invention will hereinafter be described in greater detail with reference to the accompanying drawings, in which.

DETAILED DESCRIPTION OF THE PREFERRED EMBODIMENTS

Figure 1:
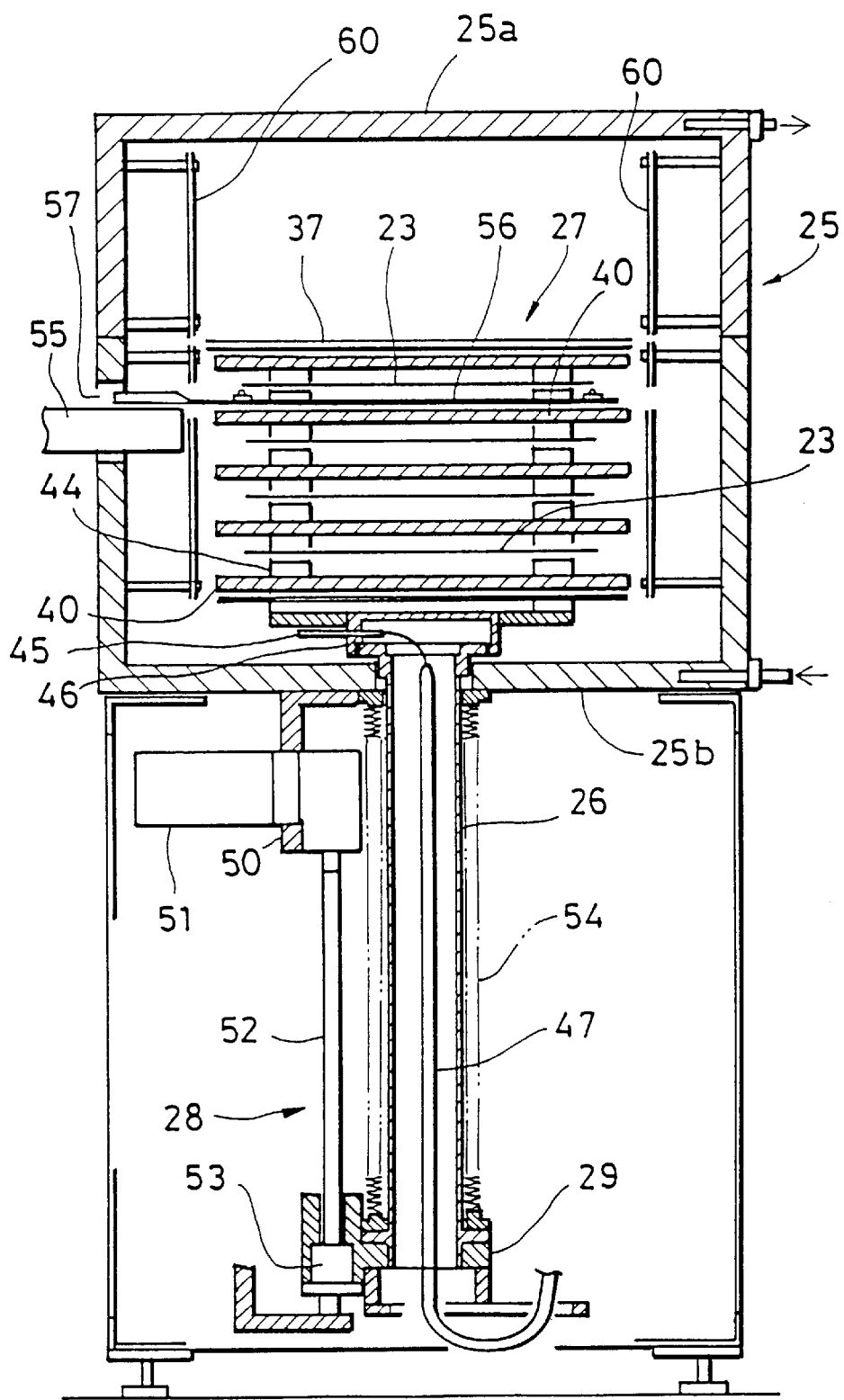
FIG. 1 is a side cross-sectional view illustrating, a first embodiment according to the present invention.

A first embodiment according to the present invention will now be described in more detail having reference to FIG. 1 to FIG. 5.

A vacuum vessel 25 has a bottom plate 25b through which a hollow strut 26 sealingly passes. The strut 26 has a substrate heating unit 27 at a top end thereof and is vertically disposed on a vertically movable platform 29 of an elevator 28 provided at an underside of the vacuum vessel 25. On an internal surface of the vacuum vessel 25, there are provided reflecting plates 60 and, though not shown, a thermocouple for measuring an internal temperature of the vacuum vessel 25. In a ceiling plate 25a and a bottom plate 25b of the vacuum vessel 25, there are formed cooling water passageways for allowing passage of cooling water to cool the ceiling plate 25a and the bottom plate 25b down to a predetermined temperature.

The substrate heating unit 27 will now be discussed.

Figure 2:
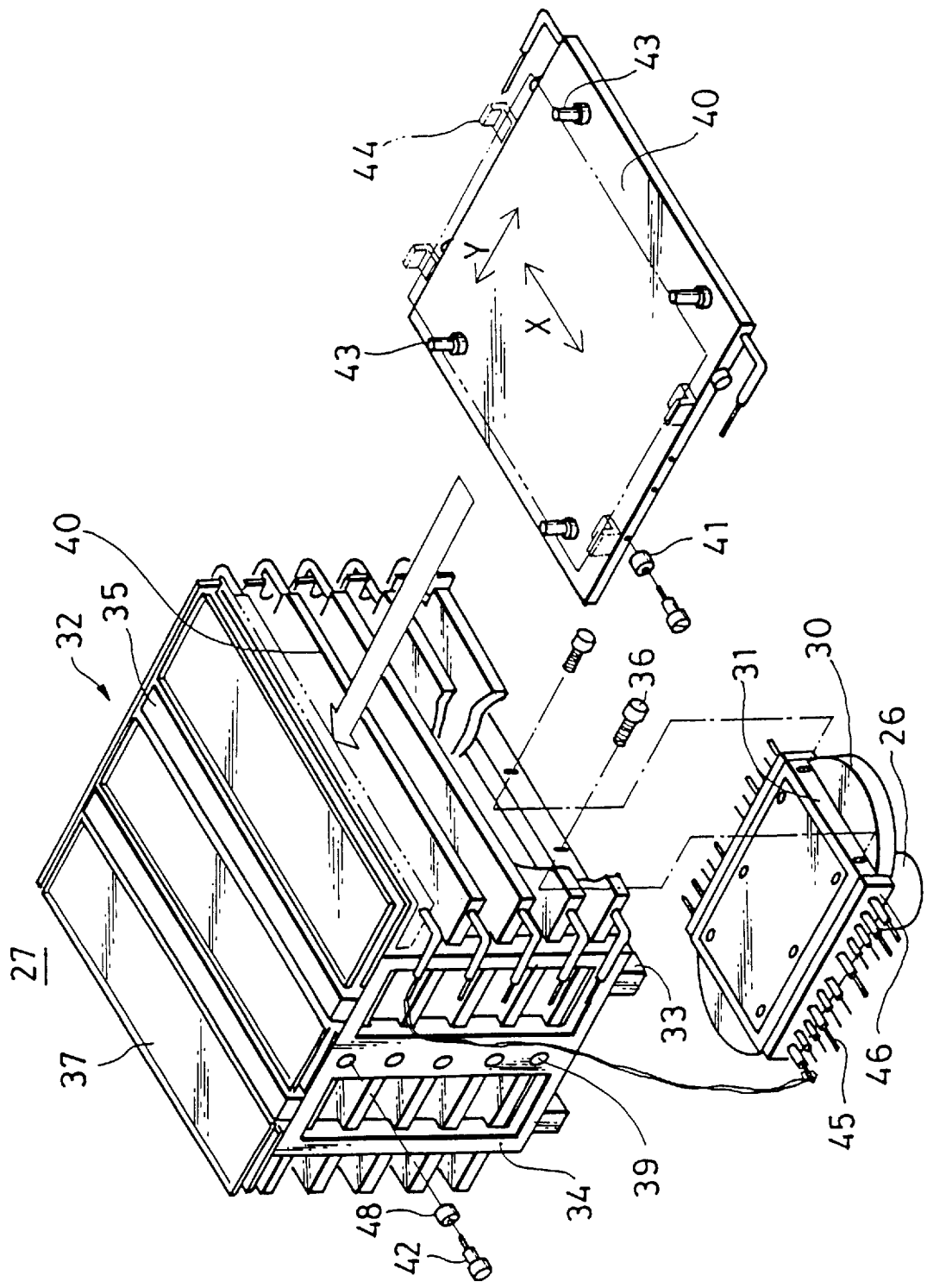
FIG. 2 is an exploded perspective view of a substrate heating unit of the first embodiment.
Figure 3:
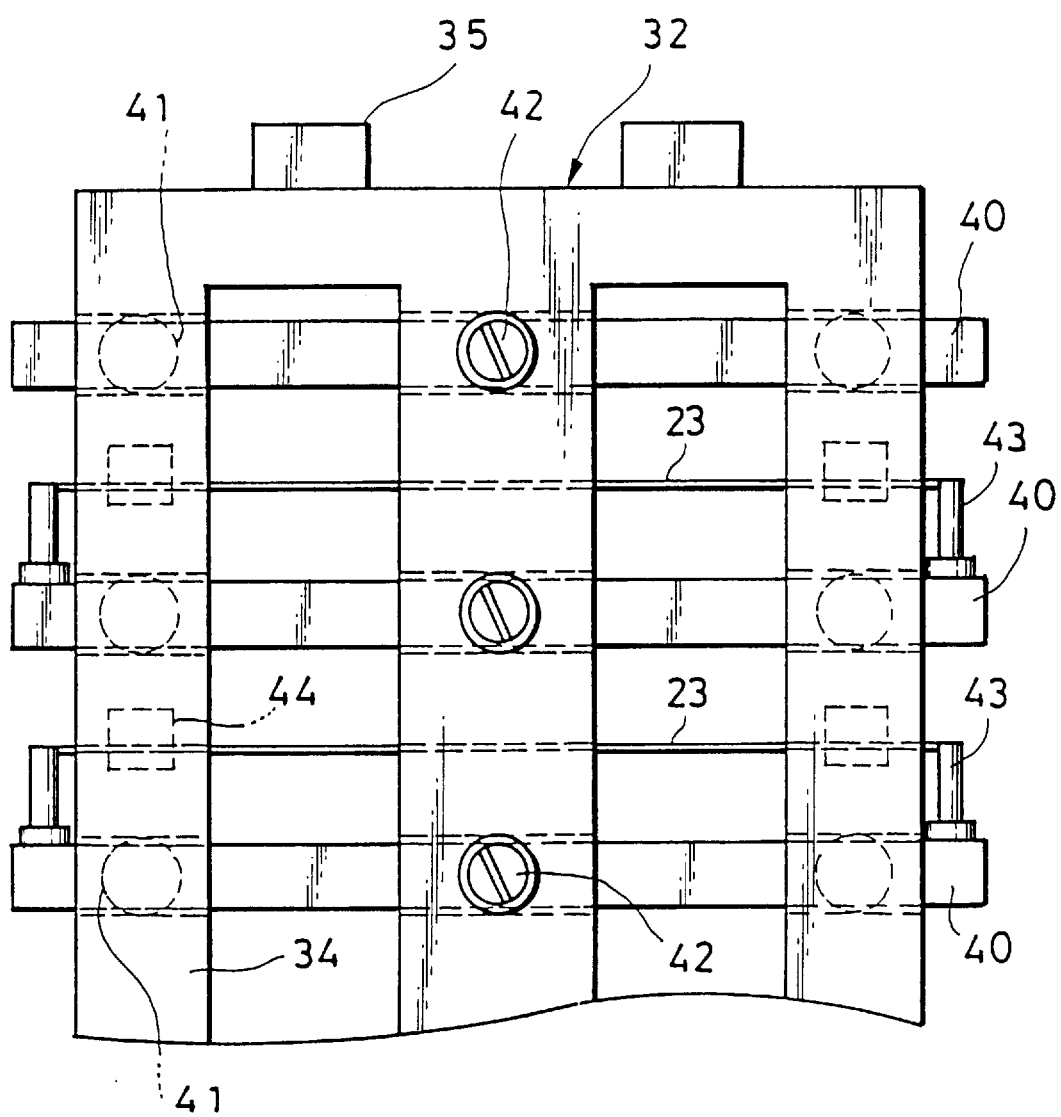
FIG. 3 is a partial side elevational view of the substrate heating unit of the first embodiment.
Figure 4:
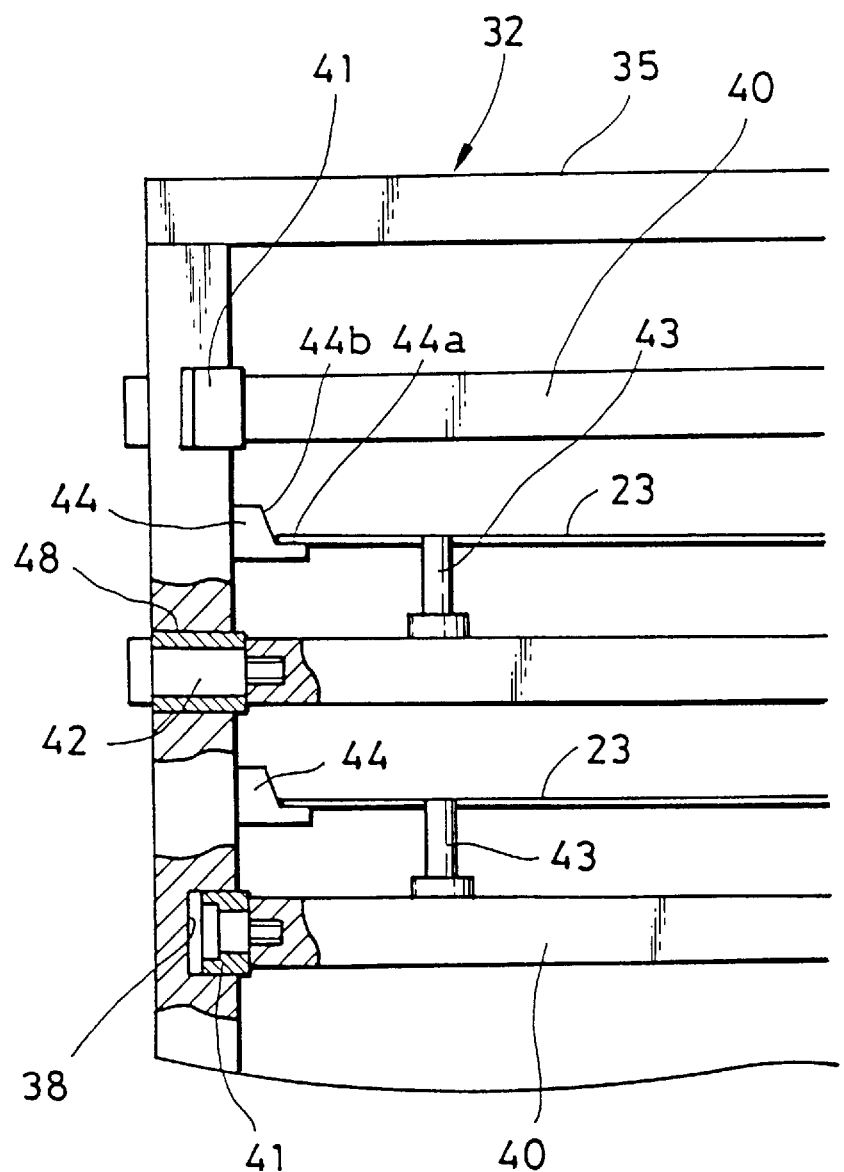
FIG. 4 is a partial front elevational view, partly cut away, of the substrate heating unit of the first embodiment.
Figure 5:
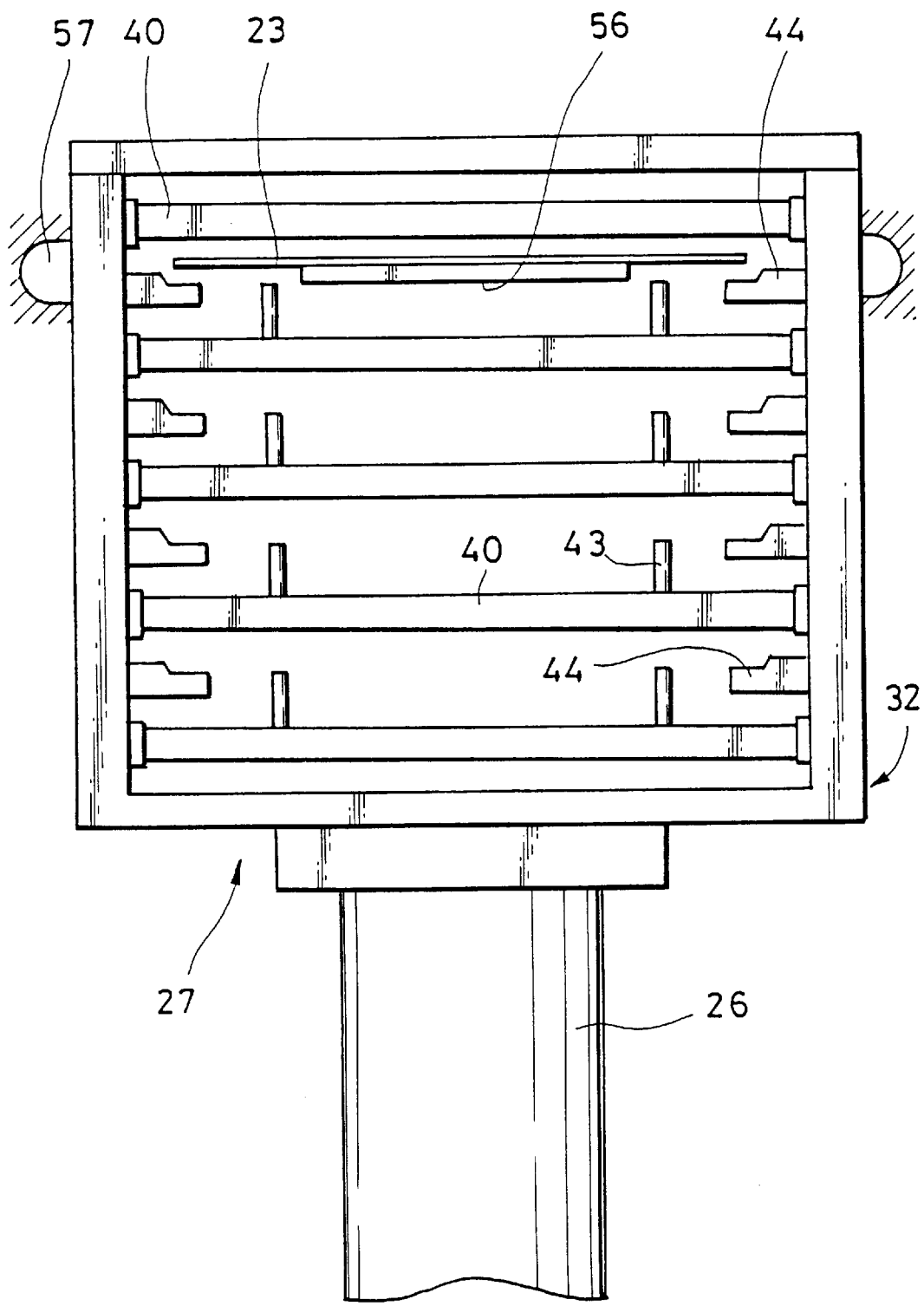
FIG. 5 is a front elevational view of the substrate heating unit of the first embodiment.
Figure 6:
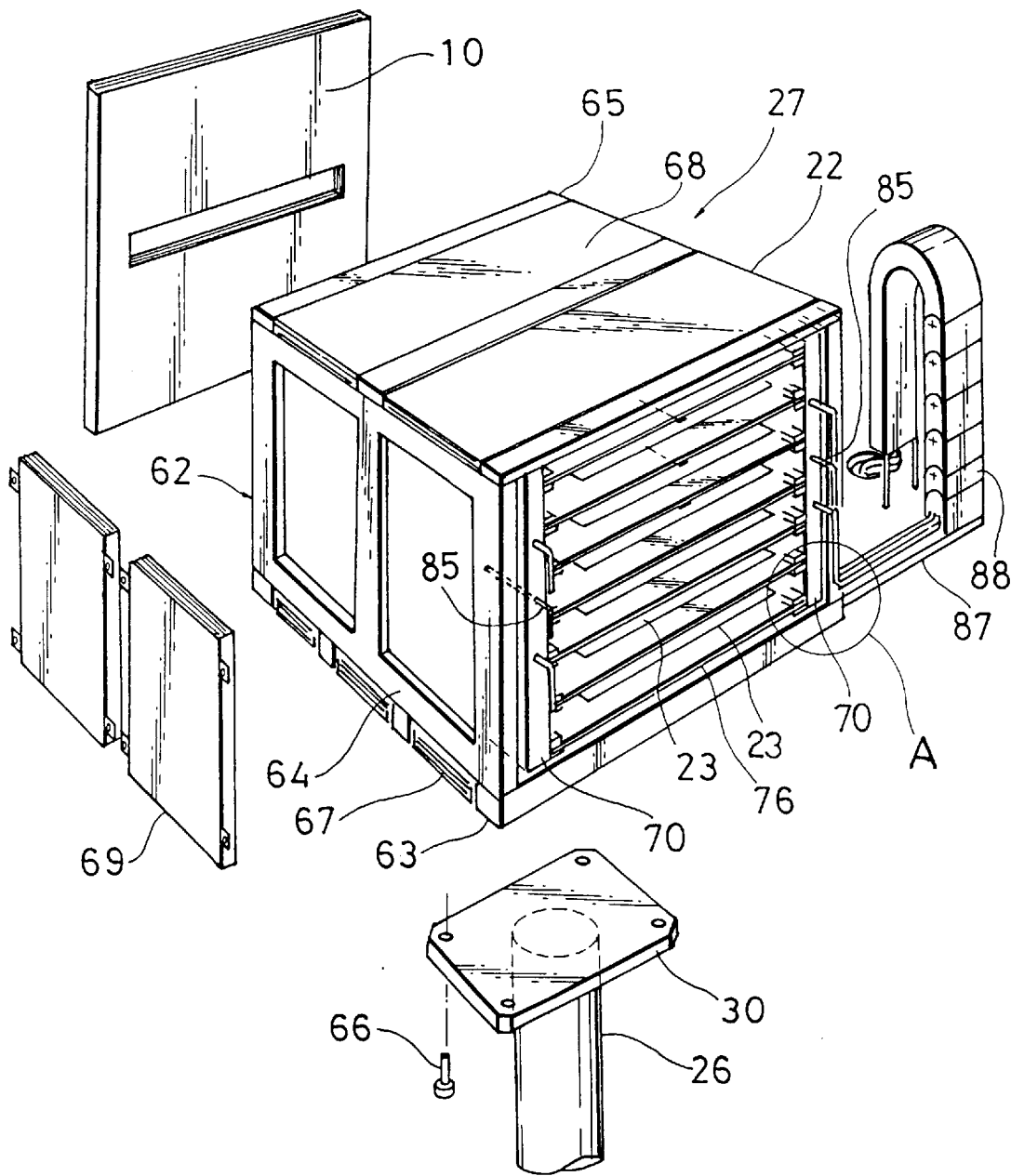
FIG. 6 is an exploded perspective view of a substrate heating unit of a second embodiment according to the present invention.
Figure 7:
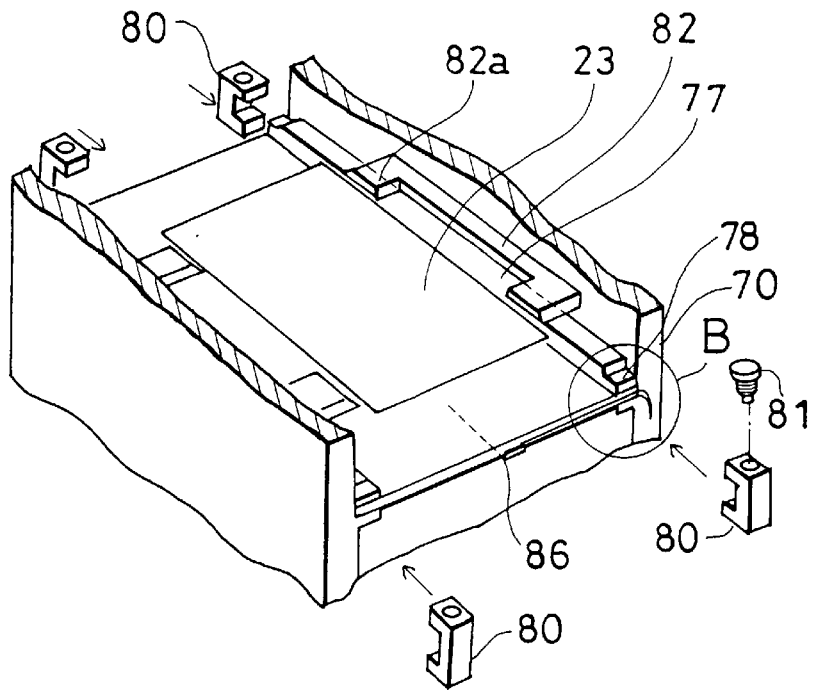
FIG. 7 is a partial front elevational view, partly cut away, of the substrate heating unit of the second embodiment.
Figure 8:
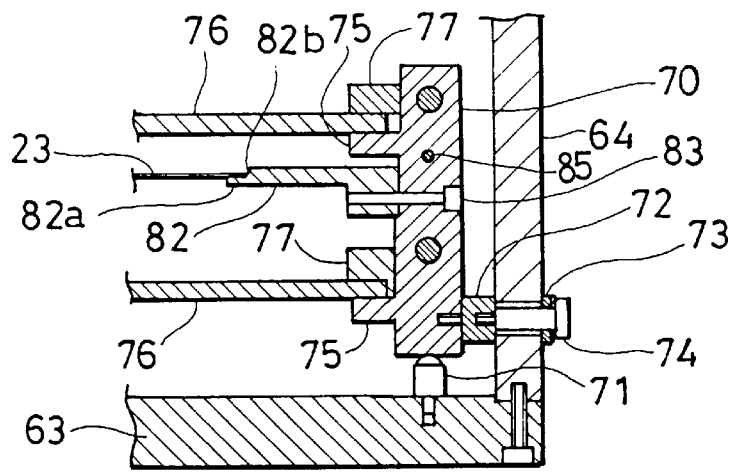
FIG. 8 is an enlarged view of portion A of FIG. 6.
Figure 9:
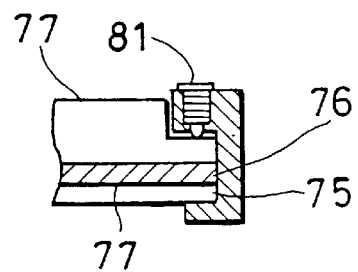
FIG. 9 is an enlarged view of portion B of FIG. 7.
Figure 10:
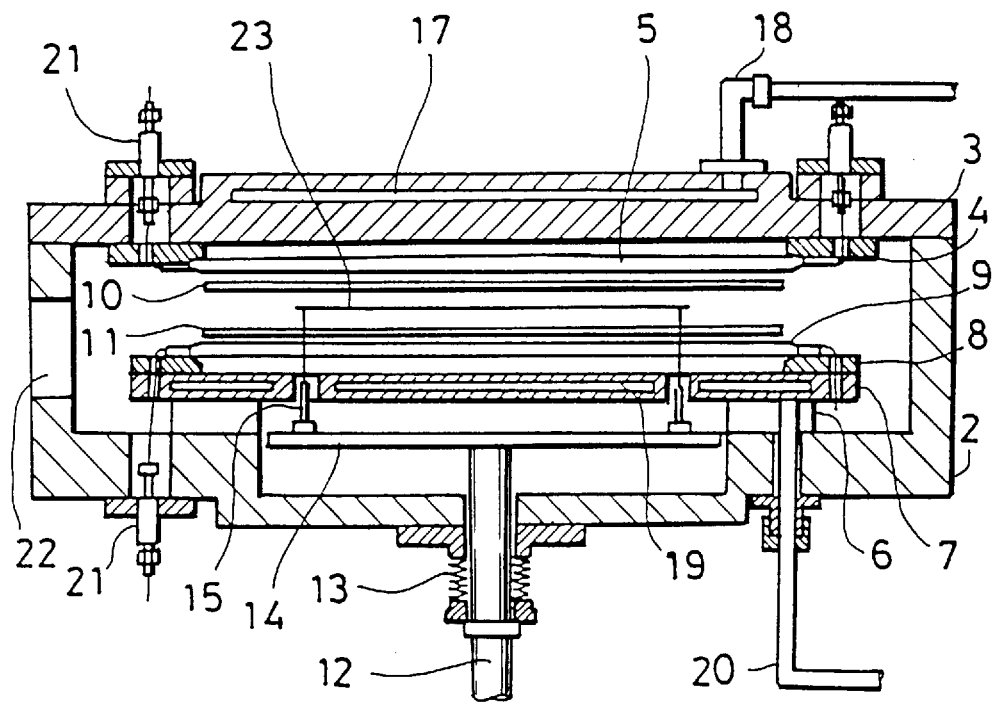
FIG. 10 is a front elevational view of a conventional apparatus.
Figure 11:
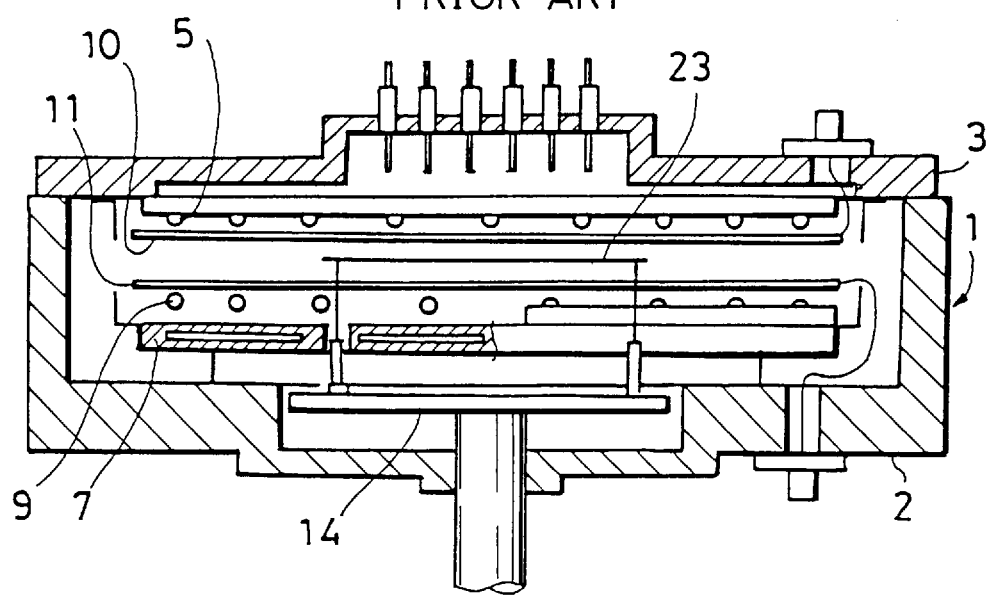
FIG. 11 is a side cross-sectional view of the conventional apparatus.
Figure 12:
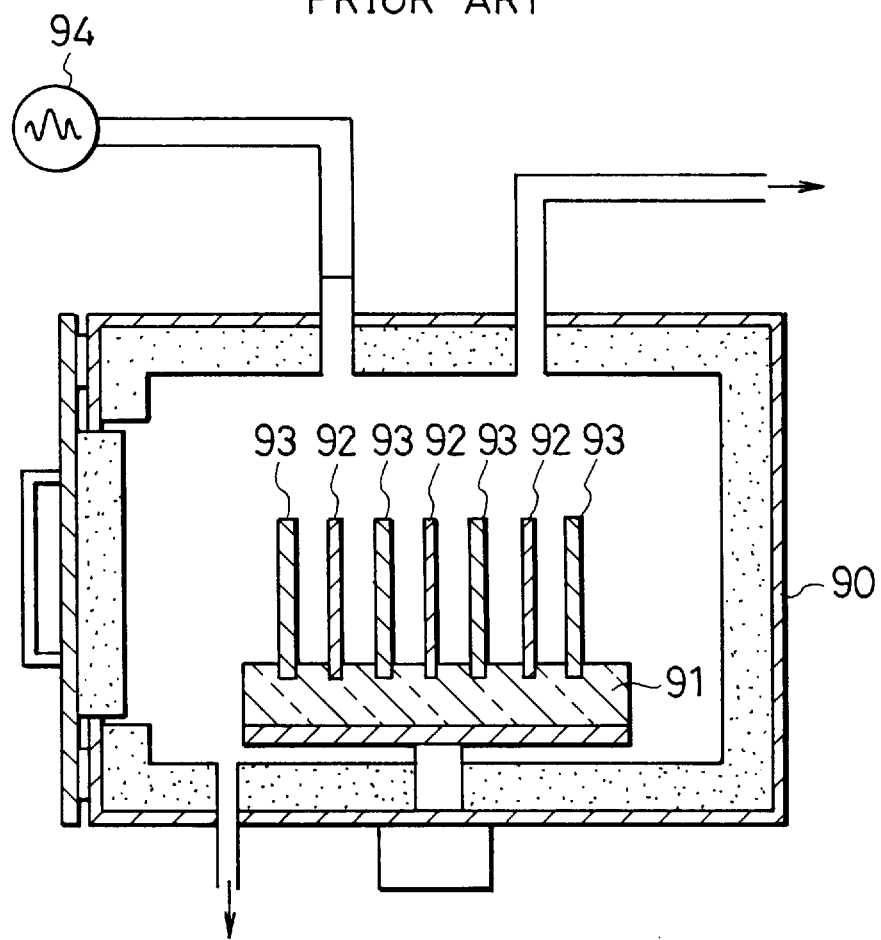
FIG. 12 is a side cross-sectional view of another conventional apparatus.

As best shown in FIG. 2, the strut 26 has a flange 30 provided at an upper end thereof, to which a pedestal 31 is secured. A heater support frame 32 is attached to the pedestal 31. The heater support frame 32 is composed of two lower beams 33, a set of side frames 34 disposed vertically on the lower beams 33, and two upper beams 35 bridged between upper ends of the side frames 34. The lower beams 33 are fastened to the pedestal 31 by means of bolts 36. On the upper ends of the side frames 34, there are provided reflecting plates 37 which jointly serve as a ceiling plate of the heater support frame 32. The side frames 34 have three side posts with a predetermined number of respective internal recesses 38 formed at a predetermined pitch. The central side post has fixing apertures 39 aligned with the recesses 38.

Opposed panel heaters 40 are cast resistive heating panel heaters made of aluminum, in which heater wires are embedded. Two heat insulative collars 41 are secured to each side of the opposed panel heaters 40 by means of fixing pins 42. The heat insulative collars 41 are designed to be slidably received in the recesses 38. The opposed panel heaters 40 are inserted into the respective recesses 38 via the heat insulative collars 41 and fixed to the heater support frame 32 by means of the fixing pins 42 inserted through heat insulative collars 48 into the fixing apertures 39. The distance between the end surfaces of the right and left heat insulative collars 41 is set to be shorter than the distance between the bottom surfaces of the opposed recesses 38. Thus, the panel heaters 40 are allowed to expand about the fixing pins 42 in a fore-and-rear direction as well as in a right-and-left (transverse) direction.

Four substrate guiding pins 43 are disposed on an upper surface of each panel heater 40. Substrate receivers 44 made from a heat insulative material are provided at positions within the side post of the side frame 34, corresponding to the upper ends of the substrate guiding pins 43. The substrate receivers 44 have rack surfaces 44a aligned with the upper ends of the substrate guiding pins 43 and guide surfaces 44b divergently inclined with respect to the rack surfaces 44a.

Secured to both sides of the pedestal 31 are terminal plates 46 carrying a predetermined number of electrical current input terminals 45, the terminal plates 46 and the opposed panel heaters 40 being electrically connected. A power source cable 47 connected to the electrical current input terminals 45 extends through the strut 26 and is connected to a source of electrical power not shown. The power source supplies electrical power to the opposed panel heaters 40 through the control of a temperature controller (not shown), and the temperature controller is adapted to control the temperature of individual opposed panel heaters 40 so that different heating temperatures do not arise between high-positioned substrates and low-positioned substrates. The heater wires embedded in the opposed panel heaters 40 may be divided into a plurality of regions so that the supply of power to the heater wires in each region can be controlled individually. This enables zone temperature control within each opposed panel heater 40. Such zone temperature control further enables fine control to keep the internal temperature of each single substrate uniform.

Discussion will now be made as to the elevator 28.

The vacuum vessel 25 has a bracket 50 secured to the lower surface thereof to which a reduction-gear-equipped vertically movable motor 51 is mounted. The vertically movable motor 51 has an output shaft connected to a screw rod 52. The vertically movable platform 29 is fitted into a guide rod not shown and capable of upward and downward movements. The vertically movable platform 29 is brought into threaded engagement with the screw rod 52 by means of a nut block 53. The strut 26 is disposed vertically on the vertically movable platform 29 and passes loosely through the bottom plate 25b of the vacuum vessel 25. The portion of the bottom plate 25b where the strut 26 passes is closed airtightly by bellows 54 attached to the strut 26.

In the drawing figures, reference numeral 55 designates a transport arm of a transport robot (not shown) for loading and unloading the substrats 23 to be treated. Designated by reference numeral 56 is a substrate carrier plate at the top end of the transport arm. Reference numeral 57 designates a substrate transport opening for allowing loading and unloading of the substrates therethrough.

Operation of the equipment will be described below.

With the substrate heating unit 27 moved down to a lowermost position by the reduction-gear-equipped vertically movable motor 51, the substrates 23 to be treated are transferred onto the substrate carrier plates 56 of the transport arm 55 and loaded into the vacuum vessel 25 through the substrate transport opening 57. The substrate heating unit 27 is moved slightly upward by the reduction-gear-equipped motor 51, following which the substrates 23 to be treated are loaded onto the substrate receivers 44. During upward movement of the vacuum vessel 25, positional adjustments of the substrates 23 to be treated are effected by the substrate guiding pins 43 in regard to a Y direction and by the guide surfaces 44b of the substrate receivers 44 with respect to an X direction. It should be noted that although the substrate guiding pins 43 are partially buried into the opposed panel heaters 40 and hence may experience positional displacement due to the thermal expansion of the opposed panel heaters 40, they are positioned with such displacement by the thermal expansion in view. Also, since the substrate receivers 44 are disposed on the heater support frame 32, they are not affected by the thermal expansion of the opposed panel heaters 40. Consequently, repeatability of the proper positioning of the substrates 23 to be treated is ensured.

As the transport arm 55 is retreated from the vacuum vessel 25, the reduction-gear-equipped vertically movable motor 51 is driven to cause the substrate heating unit 27 to move up to a position where a second-stair substrate 23 to be treated can be inserted. The sum of the amount of upward movement of the substrate heating unit 27 upon transport of the substrate 23 to be treated from the substrate carrier plate 56 onto the substrate receiver 44 and the amount of upward movement to the second-stair substrate insertable position equals to a pitch between an adjacent pair of the recesses 38.

The above-described cycle of operation for inserting the substrate 23 to be treated into the substrate heating unit 27 is repeated until all the insertion positions of the substrate heating unit 27 are filled with the substrates 23 to be treated.

Electrical power is supplied through the power source cable 47 and the electrical current input terminals 45 to each opposed panel heater 40 to heat the latter to thereby heat the substrates 23 to be treated by the radiant heat from the opposed panel heater 40. At this time, the radiant heat is prevented from being diffused by the reflecting plates 60 and 37, whereby the heating efficiency is increased.

Upon completion of the heat treatment, the substrates 23 to be treated are unloaded or taken out from the vacuum vessel 25 backwardly following the above-described operation for loading or inserting the substrates 23 to be treated.

Since a plurality of substrates 23 to be treated are heat treated at one time in the equipment according to the embodiment just described, a tact time TA (sec) can be obtained from the following equation:

$$TA=(TH+t)/n \qquad (1)$$

where TH (sec) is a substrate temperature rise time, t (sec) is a substrate transport time required for loading and unloading each substrate, and n is a number of substrates which can be heated at one time. Thus, significant reduction of the tact time is achieved by the simultaneous plural substrate heating.

A second embodiment will be explained next with reference to FIG. 6 to FIG. 9. In FIG. 6 to FIG. 9, the same reference numerals are used for corresponding parts as shown FIG. 1 to FIG. 5. The elevator 28 and the vacuum vessel 25 are identical to those described in connection with the first embodiment and hence their description will be omitted. Hereinbelow, the substrate heating unit 27 will be discussed.

The strut 26 has a flange 30 attached to an upper end thereof, to which a heater support frame 62 is secured. The heater support frame 62 is comprised of four lower beams 63, a set of side frames 64 disposed vertically on ends of the lower beams 63, and three upper beams 65 bridged between upper ends of the side frames 64. The lower beams 63 are fastened to the flange 30 by means of bolts 66.

Between the lower beams 63 and 63, there are provided reflecting plates 67. Separate reflecting plates 68 are disposed between the upper beams 65 and 65 in such manner that they jointly form a ceiling plate of the heater support frame 62. The side frames 64 carry reflecting plates 69.

Inside the side frames 64, there is provided a space of predetermined size for accommodating side panel heaters 70. The side panel heaters 70 may be cast resistive heating panel heaters made from aluminum in which heater wires are embedded. The side panel heaters 70 are placed on the lower beams 63 via support pins 71, the support pins 71 being partially buried into the lower beams 63. Spacers 72 of heat insulative material are threadedly disposed on a side of the side panel heaters 70. The spacers 72 are threadedly engaged with heater fixing bolts 74 loosely passing through the side frames 64. Between the heater fixing bolts 74 and the side frames 64, heat insulative collars 73 are sandwiched. The side panel heaters 70 are disposed in such manner that they are heat insulated with respect to the heater support frames 62.

Inside the side panel heaters 70, there are disposed a predetermined number of shelves 75 (seven shelves in the embodiment being described) spaced vertically from each other at predetermined intervals along the lengths of the heaters 70. Opposed panel heaters 76 are bridged between and supported by right and left ones of the shelves 75. Heater presses 77 are disposed oppositely from the shelves 75 to retain ends of the opposed panel heaters 76. The heater presses 77 have stepped portions 78 at ends thereof. Reference numeral 80 designates substantially U-shaped heater dampers adapted to be fit into the stepped portions 78 and ends of the shelves 75. The heater presses 77 are pressed against the opposed panel heaters 76 by turning set screws 81 threadedly inserted into the heater dampers 80 from above.

Between the shelves 75 and 75, there are provided substantially U-shaped substrate receivers 82 which are fixedly secured to the side panel heaters 70 by bolts 83 passing through the side panel heaters 70. The substrate receivers 82 have at opposite ends thereof inwardly-oriented projections 82a for carrying the substrates 23. The projections 82a is comprised of a base portion having an inclined portion 82b which effects positional adjusting of the substrates 23 to be treated when the latter are placed thereupon.

At an intermediate position of the side panel heaters 70, there is provided a thermocouple 85 for detecting the temperature of the side panel heaters 70. Similarly, a thermocouple 86 is provided at an adequate position, e.g., a central position, of a lower surface of each opposed panel heater 76 for detecting the temperature of the opposed panel heater 76. The electrical lines of the thermocouples 85 and 86 are once fastened via cable fasteners 87 together with the cables for supplying power to the side panel heaters 70 and lead through cable bearers 88 via hermetic seals (not shown) out into an atmosphere.

Operation of the equipment just described will be discussed below with reference to FIG. 1.

The reduction-gear-equipped vertically movable motor 51 is driven to cause the substrate heating unit 27 to move to a lowermost position, whereupon the substrate 23 to be treated is transported onto the substrate carrier plate 56 of the transport arm 55 and then loaded into the vacuum vessel 25 through the substrate transport opening 57. The substrate heating unit 27 is slightly moved upward by the reduction-gear-equipped vertically movable motor 51 so that the substrate 23 to be treated can be transferred onto the substrate receiver 82. As explained above, the positional displacement of the substrate 23 to be treated with respect to the substrate receiver 82 is corrected by the inclined portion 82b.

As the transport arm 55 is retreated from the vacuumvessel 25, the reduction-gear-equipped vertically movable motor 51 is driven to upwardly move the substrate heating unit 27 by a predetermined amount so that it comes to a second-stair substrate to be treated insertable position. The sum of the amount of upward movement of the substrate heating unit 27 upon transport of the substrate 23 to be treated from the substrate carrier plate 56 onto the substrate receiver 82 and the amount of upward movement to the second-stair substrate to be treated insertable position equals to a pitch between an adjacent pair of the shelves 75. In the second embodiment, simple radiant heat plates in which heaters are not embedded are used as the opposed panel heaters 76. As a result, the pitch between the shelves 75 is rendered small, whereby the amount of vertical movement of the elevator 28 is significantly reduced, thus resulting in miniaturization of the equipment.

The above-described cycle of operation for inserting the substrate 23 to be treated into the substrate heating unit 27 is repeated until all the insertion positions of the unit are filled with the substrates 23.

Electrical power is then supplied through the power source cable to each side panel heater 70 to heat the latter to heat in turn the substrates 23 to be treated by the radiant heat of the heater from sideways. The side panel heater 70 heats the opposed panel heater 76 by thermal conduction through the shelves 75.

The side panel heaters 70 may be a collective body of panel heater segments resulted from division thereof in correspondence with the opposed panel heaters 76, in which instance the heating of the panel heater segments is controlled individually, whereby control of heating of individual opposed panel heater 76 is enabled, thus avoiding the temperature discrepancies between the upper level substrates and lower level substrates. The side panel heaters 70 may not necessarily be a collective body of such panel heater segments but may be designed to include heater wires vertically divided into zones so that temperature control is effected with respect to the zones by the heater wires.

The contact pressure between the side panel heaters 70 and the shelves 75 is maintained at a proper value by turning of the threaded elements 81. The thermal conduction between the side panel heaters 70 and the shelves 75 is well effected. The opposed panel heaters 76 heat the substrates 23 to be treated from above and below by the radiant heat thereof. Since the substrates 23 to be treated are thus heated from above and below, as well as from right and left directions, they can be heated uniformly even when they become large in size. It should be appreciated that the opposed panel heaters 76 also act as soaking plates and thus contribute to obviate the nonuniformity in the temperature distribution of the substrates 23 to be treated.

The heating temperatures of the side panel heaters 70 and the heating temperatures of the opposed panel heaters 76 are detected by their respective thermocouples 85 and 86 and controlled by a controller not shown.

In order not to give contaminants to the substrates 23 to be treated, the opposed panel heaters 76 are made from a material selected from the group consisting of aluminum, stainless steel, carbon, SiC, Poly-Si, Singe-Si, etc. and may be coated with ceramics to produce improved radiant effect.

As already explained, diffusion of the radiant heat is prevented by the reflecting plates 67, 68, 69 and 60, whereby thermal efficiency is increased.

When heating is completed, the treated substrates 23 are taken out from the vacuum vessel 25 following the foregoing cycle of transport operation backwardly.

It should readily be appreciated that the side panel heaters 70 as applied to the second embodiment can also be applied to the first embodiment.

As thus far explained, the present invention enables concurrent heating. of plural substrates, whereby a tact time is reduced significantly. Moreover, the heating unit is rendered compact by virtue of the panel heaters used in place of the conventional heating lamps and far-infrared radiating plates.

What is claimed is:

1. A substrate heating equipment for use in a semiconductor fabricating apparatus, comprising a heater support frame disposed within a vacuum vessel, a plurality of opposed panel heaters individually temperature controlled and disposed in a plural shelved fashion within said heater support frame, and support means for supporting a substrate to be treated between an adjacent pair of said opposed panel heaters.

2. A substrate heating equipment for use in a semiconductor fabricating apparatus according to claim 1, wherein the opposed panel heaters each have a first and second end, the substrate heating equipment further comprising side panel heaters disposed at both ends of said opposed panel heaters.

3. A substrate heating equipment for use in a semiconductor fabricating apparatus according to claim 1, wherein said opposed panel heaters are secured to said heater support frame at central portions of side portions thereof, an insulative collar is disposed at each side end of said opposed panel heaters, and said insulative collar is fit into recesses disposed in said heater support frame.

4. A substrate heating equipment for use in a semiconductor fabricating apparatus according to claim 1, wherein said heater support frame includes a substrate receiver attached thereto and being capable of loading said substrate to be treated along one edge of the substrate to be treated, and said opposed panel heaters include a substrate guiding pin partially buried therein and adapted to guide an opposite edge of said substrate to be treated.

5. A substrate heating equipment for use in a semiconductor fabricating apparatus according to claim 2, wherein the heater support frame incudes side frames and wherein said side panel heaters are heating elements and are thermally insulated from at least the side frames of said heater support frame, said opposed panel heaters are bridged between right and left ones of said side panel heaters, and said opposed panel heaters are heated through thermal conduction by said side panel heaters.

6. A substrate heating equipment for use in a semiconductor fabricating apparatus according to claim 5, wherein said side panel heaters are vertically divided into a plurality of heating zones which are individually temperature controlled.

7. A substrate heating equipment for use in a semiconductor fabricating apparatus according to claim 5, wherein said side panel heaters have shelves capable of receiving the ends of said opposed panel heaters, the ends of said opposed panel heaters being pressed against said shelves by press means.

8. A substrate heating equipment for use in a semiconductor fabricating apparatus according to claim 7, wherein said press means comprises heater presses disposed on the ends of said opposed panel heaters, heater dampers fitted about said heater presses and said shelves, and set screws screwed into engagement with said heaters clampers for pressing said heater presses against said opposed panel heaters.

9. A substrate heating equipment for use in a semiconductor fabricating apparatus according to claim 1, wherein said heater support frame has reflecting plates.

10. A substrate heating equipment for use in a semiconductor fabricating apparatus according to one of claims 1 to 9, wherein said vacuum vessel is adapted to allow loading of said substrates through a side wall thereof, said heater support frame is supported by a strut passing in an airtight manner through a bottom plate of said vacuum vessel, said strut including a screw rod connected thereto by means of a nut, and said screw rod being adapted to be rotationally driven by a vertically movable motor.

11. A substrate heating equipment for use in a semiconductor fabricating apparatus according to claim 2, wherein each of said side panel heaters is divided into a plurality of zones, and said opposite panel heaters are individually temperature controlled by controlling each zone of said side panel heaters.

12. A substrate heating equipment for use in a semiconductor fabricating apparatus according to claim 1, wherein said opposite panel heaters are cast panel heaters of aluminum in which heater wires are embedded.

13. A substrate heating equipment for use in a semiconductor fabricating apparatus according to claim 1, wherein said side panel heaters are cast panel heaters of aluminum in which heater wires are embedded.

14. A substrate heating equipment for use in a semiconductor fabricating apparatus according to claim 2, wherein each of said opposite panel heaters are divided into a plurality of zones, and said zones are individually temperature controlled.

15. A substrate heating equipment for use in a semiconductor fabricating apparatus according to claim 2, wherein each of said opposite panel heaters are divided into a plurality of zones, and said zones are individually temperature controlled.

* * * * *